INVENTORS.
Richard J. Lindeman.
Anthony T. Monaco,
By Mueller & Aichele Att'ys.

INVENTORS.
Richard J. Lindeman,
Anthony T. Monaco,
By Mueller & Aichele
Attys.

INVENTORS.
Richard J. Lindeman,
Anthony T. Monaco,
By Mueller & Aichele Attys.

TUNING APPARATUS HAVING COMMON VERNIER REACTANCE

Filed July 3, 1959 5 Sheets-Sheet 4

INVENTORS.
Richard J. Lindeman
Anthony T. Monaco,
By Mueller & Aichele
Att'ys.

TUNING APPARATUS HAVING COMMON VERNIER REACTANCE

Filed July 3, 1959 5 Sheets-Sheet 5

INVENTORS.
Richard J. Lindeman,
Anthony T. Monaco,
By Mueller & Aichele Atty's.

United States Patent Office 3,069,638

Patented Dec. 18, 1962

3,069,638

TUNING APPARATUS HAVING COMMON VERNIER REACTANCE

Richard J. Lindeman, Elmwood Park, and Anthony T. Monaco, Skokie, Ill., assignors to Motorola, Inc., Chicago, Ill., a corporation of Illinois Filed July 3, 1959, Ser. No. 824,862

11 Claims. (Cl. 334—51)

This invention relates generally to tuners for television receivers, and more particularly to a television tuning device for manual and/or automatic channel selection with the fine tuning which may be preset, and which tuning device may provide ultra high frequency tuning as well as very high frequency tuning.

Tuners for television receivers usually include a rotary channel selector switch having twelve positions corresponding to channels in the very high frequency (VHF) band and a position for use in receiving channels in the ultra high frequency (UHF) band. The channel selector includes wafers which have circuit components mounted thereon and switch contacts for selectively connecting the components. This forms a relatively complex structure which must be carefully constructed and which therefore is quite expensive.

Such tuners generally have a fine tuning device which makes it possible to accurately tune the individual VHF channels as they are selected. The VHF channels are in two separate spaced frequency bands and fine tuning devices which operate to provide the required tuning range in one band may not provide adequate range in the other band. Also, it is generally necessary to adjust the fine tuning each time a different VHF channel is selected, because the prior fine tuning adjustment when carried over to the new channel is not the best setting for the new channel. Or, the fine tuner may change automatically to a center position and must therefore be set for the new channel.

It is desirable, therefore, to provide a fine tuning device which controls each channel independently of the others so that the viewer can preset the fine tuning to obtain the desired pitcure on all channels without having to retune each time a new channel is selected. This is particularly important where the television receiver is provided with a remote control system, because the convenience with which the viewer can select the channels from a place remote from the receiver is largely offset if it is necessary to manually adjust the fine tuning when a new channel is selected.

The fine tuning control may also be used to operate the ultra high frequency tuner to permit selection of any of the eighty individual UHF channels. For the tuning system to provide the various tuning functions such as remote and local VHF channel selection, fine tuning and UHF tuning, and yet be of simple construction to reduce manufacturing and servicing costs, an integrated mechanism must be provided such that multiple functions are performed by the same parts. Thus, a basic mechanism should be adapted to perform any or all of the above tuning functions, with the number of additional parts required as the number of functions is increased being minimized.

An oject of the present invention is to provide an improved an improved tuner for television receivers which may be easily constructed and which forms a compact unit.

A further object is to provide a television tuner including a channel selector and a fine tuner in which the fine tuner has substantially the same tuning range for channels of different frequencies.

Another object of the present invention is to provide a combined channel selector and fine tuner for television receivers in which the fine tuning of each channel may be adjusted and preset independently of the other channels.

A still further object of the invention is to provide a simple tuner structure in which a channel selector and preset fine tuner mechanism may be directly coupled to an ultra high frequency tuning section to provide continuous tuning of the UHF channels.

Still another object is to provide a motor driven television tuner with a preset mechanism which provides individual channel fine tuning, and which may also serve as an indexing device for the motor driven channel selector.

A feature of the invention is the provision of a television tuner of the channel selector type with wafers for the various tuner sections having circuit elements thereon and switch contacts for selectively connecting the elements, and with the elements all being on one side of each wafer and having terminals extending to the other side and secured together on the other side as by dip soldering. The elements may include a cylindrical conducting strip at the edge of a wafer forming inductor sections for high frequency channels.

Another feature of the invention is the provision of a television tuner having a channel selector for selecting channels in two frequency ranges which are spaced from each other, with a fine tuning device including a coil and a conducting core movable therein which is resonant at a frequency between that utilized in the ranges, and which provides substantially the same tuning variation upon movement of the core for channels in the two frequency ranges.

A feature of the invention is the provision of a tuner for television receivers including a channel selector and a fine tuning device having a spring biased element for controling its tuning effect, and a rotary cam which causes movement of the element to various tuning positions. The cam may include a wheel coupled to the channel selector and having a plurality of independently adjustable members thereon located in positions corresponding to the individual channels, with a rotary device for adjusting the cam members coupled to a fine tuning shaft which is movable both axially and rotatably, and with the adjusting device being brought into engagement with the cam member corresponding to the selected channel upon axial movement of the fine tuning shaft and adjusting the cam member by rotary movement of the shaft.

A further feature of the invention is the provision of a television tuner including an ultra high frequency section and a fine tuning section, with a fine tuning shaft movable both axially and rotatably, a mechanism disengageably coupling the shaft to the ultra high frequency section when the shaft is axially released to provide continuous tuning of the ultra high frequency channels, and another mechanism disengageably coupling the shaft to the fine tuning section when the shaft is depressed to provide fine tuning adjustment.

Another feature is the provision of a motor driven television tuning system of the channel selector type including a tuning mechanism having a wheel provided with one set of cams for controlling fine tuning adjustments as described above, and another set of cams for indexing a motor which is started locally or remotely and drives the channel selector, and with the indexing cams actuating a switch to stop the motor when the channel selector reaches the desired position.

Still another feature is the provision of a motor driven television tuning system including a channel selector having a wheel with indexing cams cooperating with an index switch for controlling the motor and with other cams for providing fine tuning control, and including reduction gears coupling the channel selector to the motor, with a Geneva movement gear and a motor switch actuated thereby to coordinate the gear system with the index cams and index switch.

The invention is illustrated in the accompanying drawings in which:

FIG. 7 is a circuit diagram of the television tuner of the invention including VHF and UHF tuning sections;

Figures 1, 2, 3, 4, 5:
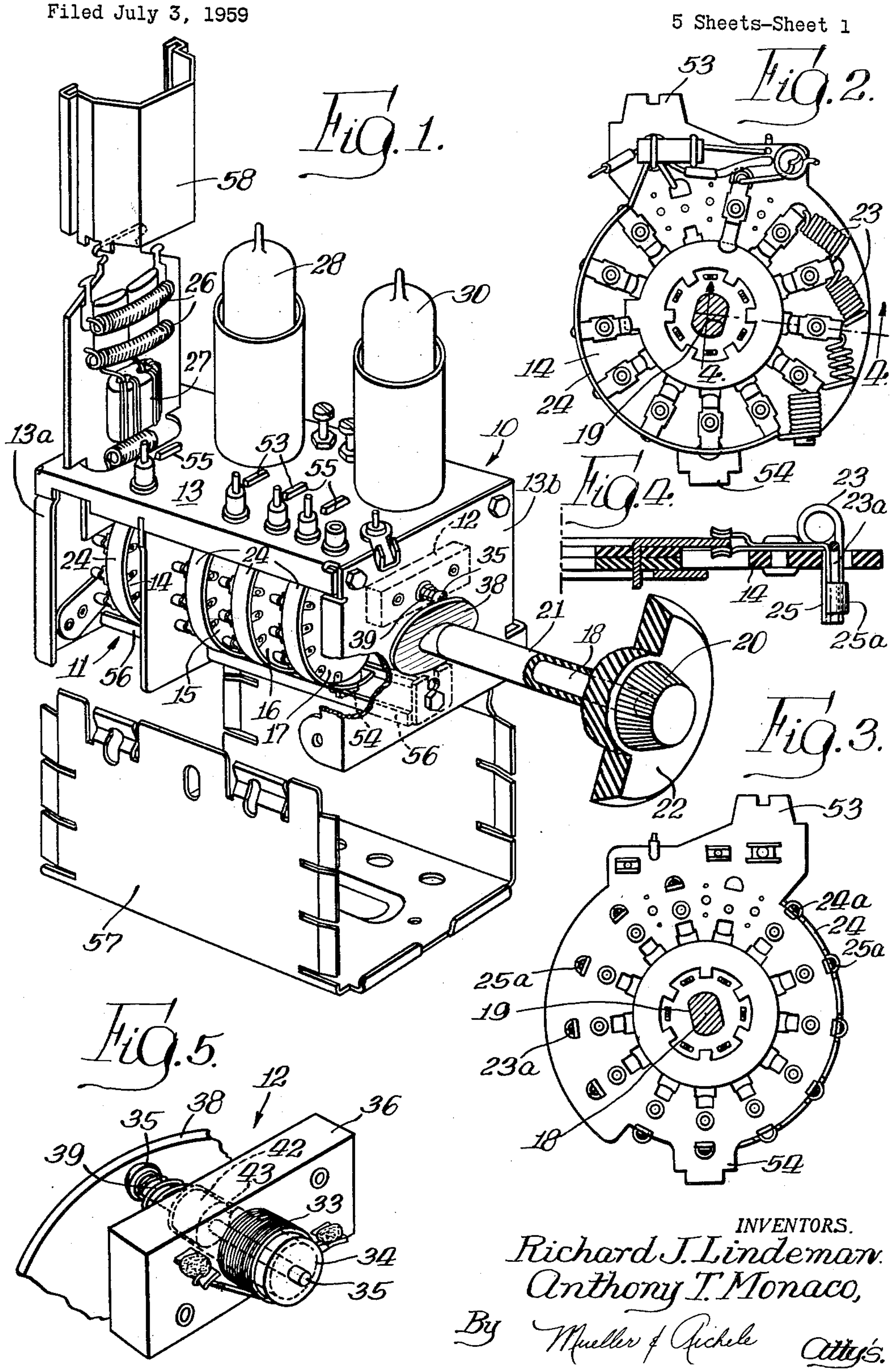
FIG. 1 is a perspective view of a television tuner in accordance with the invention.
FIGS. 2 and 3 are plan views showing the two sides of a wafer of the tuner of FIG. 1.
FIG. 4 is a cross section view through the wafer along the lines 4—4 of FIG. 2.
FIG. 5 is a perspective view of the fine tuning device.

The invention provides a tuner for television receivers which includes a channel selector and a fine tuning device. The channel selector includes wafers with circuit elements thereon and switch contacts for selectively connecting the elements on the wafers. The circuit elements are all provided on one side of each wafer with terminals extending to the other side where they are interconnected as by dip soldering. The fine tuning device includes a variable circuit component with a movable element which is positioned by a rotary cam structure. The device may be a coil having distributed capacity to tune the same between the two frequency ranges which includes the channels to be selected, and a conductor movable in the coil to vary the inductive and capacitive effect thereof in the two frequency ranges. The cam structure may be an angularly disposed plate for manual rotation, or a cam wheel having a plurality of cams, such as adjustable screws, carried thereon. The wheel is mounted on and rotates with the channel selector shaft so that the cam corresponding to the selected channel is aligned with the adjusting device. A fine tuning shaft, which may be either coaxial with, or off-set from, the channel selector shaft, is movable axially to engage the adjusting device with the cam aligned therewith, and is rotatable to turn the adjusting device and preset the engaged cam. A cam follower is engaged by the cam corresponding to the selected channel and controls the fine tuning circuit element to establish the desired tuning.

The initial or released position of the axially movable fine tuning shaft may be utilized to provide continuous ultra high frequency tuning. With this arrangement, the fine tuning shaft is effectively coupled to the preset fine tuner when it is in the depressed position, and the shaft is effectively coupled to the ultra high frequency tuning section when it is in the released position.

Automatic motor driven channel selection may be provided, and a dual-purpose cam wheel may control the fine tuning and also the energization of the drive motor to stop the motor when the channel selector reaches a predetermined position. This is accomplished by providing a second set of cams on the cam wheel, selected ones of which are positioned to actuate an indexing switch in the motor circuit as they move in succession to the predetermined position. The automatic tuning system may involve several functions which are controlled by or are coordinated with the dual-purpose cam wheel.

Referring to FIGS. 1–6 of the drawings, there is shown a television tuner 10 including a very high frequency (VHF) section 11 of the rotary channel selector type, with a fine tuner 12. The VHF section 11 includes a housing 13 and rotary switch wafers 14—17 controlled by a channel selector shaft 18 which extends through the wafers and is journalled in the housing, and which has an actuating knob 20 positioned on the outside of the receiver cabinet. A hollow shaft 21, about the shaft 18 is the control for fine tuning and is provided with a control knob 22 also positioned outside the receiver cabinet.

All of the wafers 14—17 are of the same basic construction shown in FIGS. 2–4, and each has circuit elements such as the coils 23 and the conductive strip 24 mounted on one side thereof. The wafers include a rotary switch element which fits on a flattened portion 19 of the selector shaft 18, and is rotated thereby to selectively connect the elements. The coils are selected by the rotary switch to tune in the low-range channels (2–6), and various sections of the strips are selected by the switch to tune in the high-range channels (7–13). It may be noted that the strip 24 is cylindrical and extends around the circular edge of the wafer, and is mounted perpendicularly with respect to the wafer. Connectors 25 are secured to the switch contacts and have portions bent to form tubular cavities **25*a* extending on the opposite side of the wafer from the coils and strips. The ends 23*a* of the coils 23 extend into the cavities 25*a* as shown in FIG. 4, and the extensions 24*a* of the strip 24 extend into other cavities 25*a*. This construction makes the wafers more compact and permits the electrical connections to be made by dipping the connectors 25 in solder. The solder rises in the tubular cavities to make a good electrical connection between the parts. The insulating wafer body 14 protects the circuit elements 23 and 24** during the soldering operation, and mechanical connectors such as eyelets, clips and the like which may produce faulty electrical connection are avoided.

The wafers have projecting portions 53 and 54 for mounting the same on the frame 13. The side portion of the frame includes apertures 55 for receiving the portions 53, and a strut 56 has slots therein for receiving the portions 54. The strut 56 is removably supported on a fixed end section **13*a* and a removable end section 13*b* of the frame 13, and the shaft 18 which extends through the wafers is also supported in bearings provided in these sections. The side section of the frame 13** forms a chassis and supports circuit components including the tubes 28 and 30, which are connected to the circuit elements on the wafers. A shield 57 cooperates with the frame 13 to provide an enclosing housing about the wafers. A shield 58 is provided for the antenna input section of the tuner, which includes the elements 26 and 27.

Figures 6, 19, 20, 21, 22, 23:
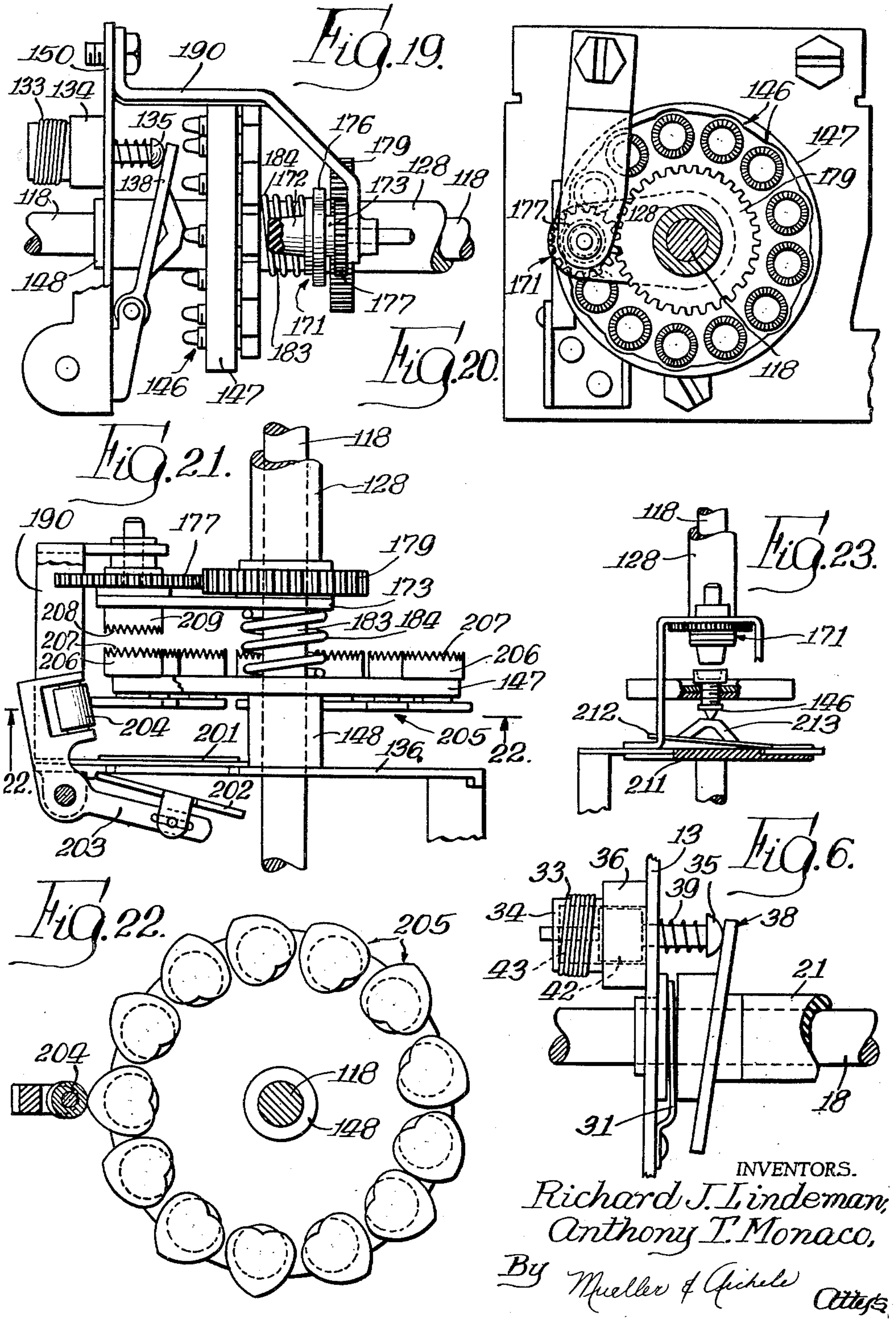
FIG. 6 is an enlarged side view of the fine tuning device.
FIG. 19 shows another embodiment of the invention in which the channel selector shaft and the fine tuning shaft are coaxial.
FIG. 20 is an end view of the embodiment of FIG. 19 showing particularly the rotary adjusting device and the driving gears therefor.
FIG. 21 is a plan view of an embodiment of the invention in which the control members are disc cams and the fine tuning circuit element is a capacitor.
FIG. 22 is a sectional view taken along line 22—22 of FIG. 21 showing in particular the shape of the disc cams.
FIG. 23 is a plan view of a variation of the variable capacitor fine tuning mechanism.
Figures 17, 18:
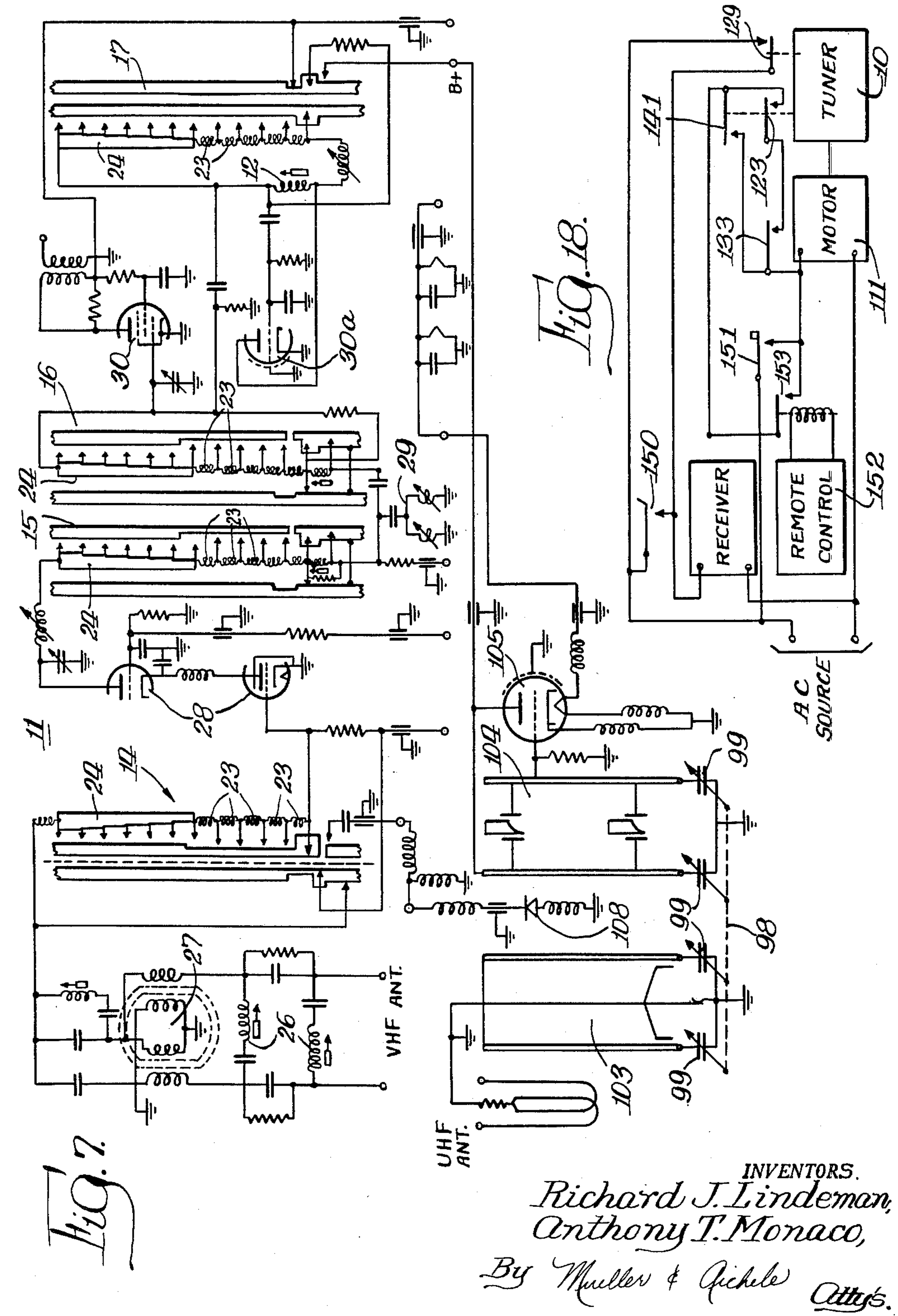
FIG. 17 shows the interlock switch for the Geneva motion.
FIG. 18 is a schematic diagram of the motor driving circuit.
Figures 8, 9, 10, 11:
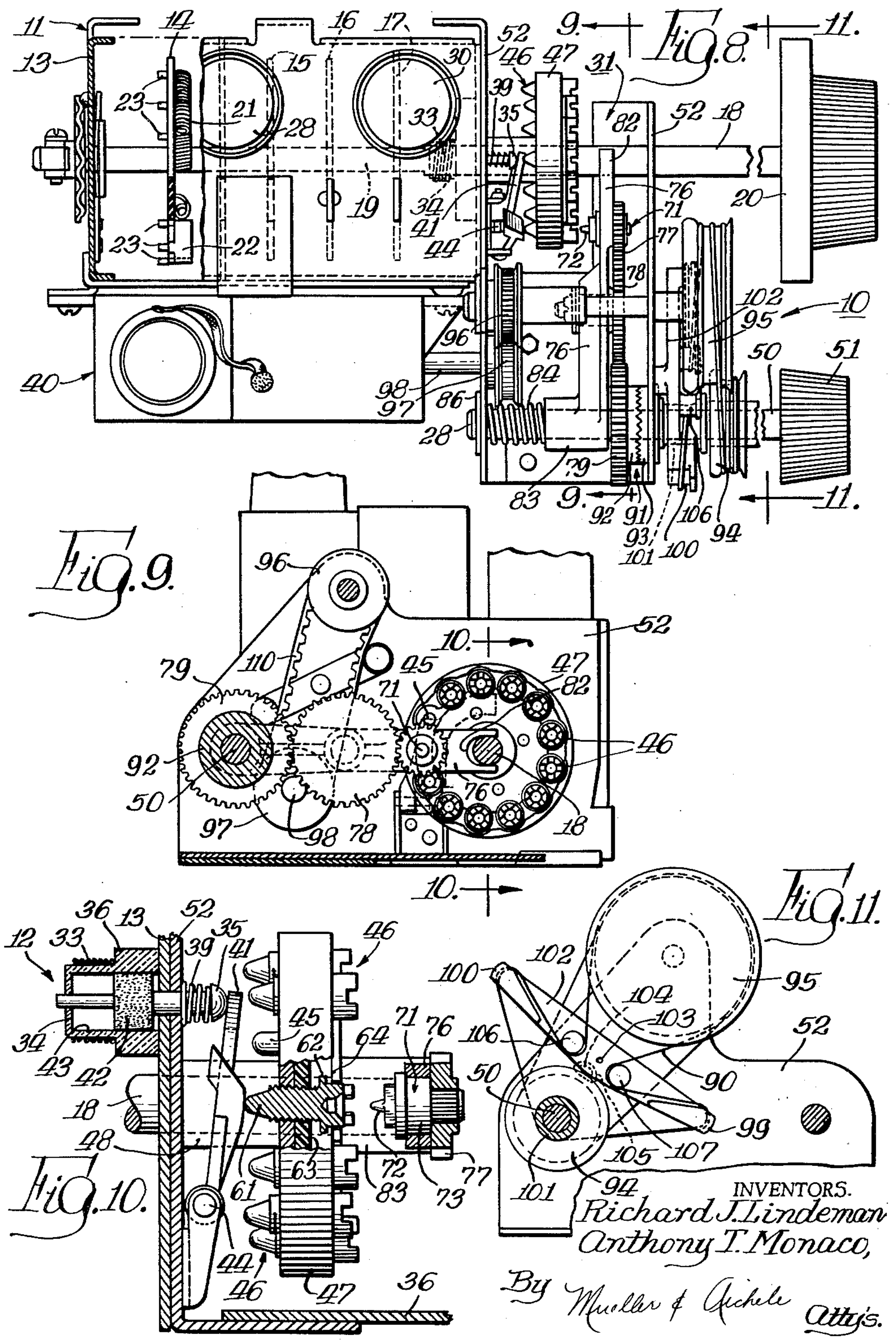
FIG. 8 is a plan view, partly in section, of a composite television tuner forming one embodiment of the invention, having a VHF channel selector, a preset fine tuning mechanism and a UHF section.
FIG. 9 is an enlarged sectional view taken along lines 9—9 of FIG. 8 showing in particular the preset fine tuning mechanism.
FIG. 10 is a sectional view taken along lines 10—10 of FIG. 9 showing particularly the cam follower and the adjustable cam wheel device of the fine tuning mechanism.
FIG. 11 is an end view of the embodiment of FIG. 8 taken along lines 11—11 showing part of the pulley system for coupling the fine tuning shaft to the UHF section.

The fine tuning device 12 is shown in detail in FIGS. 5, 6 and 10. This includes a coil 33 wound on a tubular insulating form 34, with a core extending into the form including a supporting rod 35 having a core 42 thereon. The core moves in a recess 43 in the form 34 to various positions with respect to the coil 33. The core 42 is made of powdered iron and its position changes both the inductance and the capacity of the coil. The wall of the form 34 about the recess is very thin so that the capacity change produced by movement of the core is quite large. The coil form 34 has a mounting base 36 connected to the housing 13, and the rod 35 extends through the housing. The core is operated by a cam which in this embodiment is a cam wheel or plate 38 connected to shaft 21 and disposed angularly with respect to shaft 21. The rod is biased against the wheel 38 by a spring 39. The wheel 38 is supported on a collar which is held to the housing 13 by a spring 31. As the shaft 21 is rotated, the part of wheel 38 engaging the rod 35 moves toward and away from the coil 33 to position the core 42 within the coil. The position of the core 42 determines the reactance of the coil 33 which changes the effective reactance of the circuit in which it is connected and therefore establishes the fine tuning of the television receiver with which the tuner 10 is associated.

FIG. 7 is a circuit diagram which shows the circuit of the VHF section of the tuner including the fine tuner 12. This also shows an ultra high frequency section which will be described hereafter. The input from the VHF antenna is applied through a filter including the coils 26 and through a balun 27 which converts the balanced input to a single ended input. The signal is applied from the balun to the wafer 14, which operates to selectively connect various sections of the strip 24 and the coils 23 to provide the required inductance for a selected channel. The selected signal is applied to the cascode amplifier including the two sections of tube 28. The output of the amplifier is applied to the wafer 15 which further selects the signal. The signal is applied through coupling section 29 to the grid of mixer tube 30. The grid circuit of the mixer is tuned by elements on the wafer 16. The triode section 30*a*, which may be included in the same envelope as the mixer section 30, is coupled to the wafer 17 to form an oscillator which applies signals to the grid of mixer tube 30. The output of the tuner is derived from terminal 31 which provides a constant intermediate frequency output. It will be noted that the finer tuner 12 is connected across the inductance of the wafer 17 to provide fine tuning of the oscillator.

The VHF television band includes two spaced frequency ranges. The oscillator frequency may vary from 100–130 megacycles on the low-range channels and from 220 to 259 megacycles on the high-range channels. The fine tuning device 12 including coil 33 and core 42 is parallel resonant at 140 mc., between the two used ranges, when the core is at its mid-range position. Above this frequency the unit is capacitive and below this frequency it is inductive. Frequency changes are produced in the high-range channels primarily due to the change in capacitance created by the proximity of the core and also by the change in resultant capacitance with the varying resonant frequency determined by the changing core position. On the low range channels, the frequency change is produced mainly by the inductive change with movement of the core. The fine tuning device provides a wide and relatively uniform fine tuning range for all channels.

In FIGS. 8–11 there is shown the tuner 10 including the VHF section 11 previously described with the fine tuner 12, combined with a UHF section 40. The fine tuning device is of the same construction as described above but it is operated in a different way. More particularly the actuator is arranged to be preset for the various VHF channels, and the setting is combined with the control for the UHF tuner.

Referring particularly to FIGS. 8 and 10, it will be seen that the rod 35 supporting the core 42 of the fine tuner is engaged by a cam follower provided by rocker 41 which is pivoted at 44. The cam follower or rocker 41 is controlled by a plurality of adjustable control members or cams 46 which in the embodiment of FIGS. 8–11 are double slotted screws. There are twelve of these screws 46 mounted in a circular array on a cam wheel 47 and spaced angularly to correspond to positions 2–13 of the channel selector. The member 45 corresponds to the ultra high frequency position of the channel selector and is not adjustable because the ultra high frequency tuning is independent of the cams, as will be explained further.

The cam wheel 47 has a hub 48 (FIG. 10) through which the channel selector shaft 18 extends. The hub 48 is in the form of a sleeve which is keyed to the channel selector shaft 18 so that the wheel 47 rotates with shaft 18 as the channels are selected. The cam screws 46 are spaced angularly about the center of disc 47 such that when a channel is selected the corresponding cam screw revolves to the position occupied by the screw shown in section in FIG. 10. The screws are threaded through the wheel 47 and therefore will move axially when rotated. The wheel 47 has a recessed surface 63 which is engaged by a flange 62 on each screw to limit the screw's axial movement in one direction, and wheel 47 has a radially projecting lip 64 which is engaged by the flange 62 to limit the screw's axial movement in the opposite direction. The tapered end 61 of each screw is engageable with the rocker arm 41, and it may be seen that the axial position of the screws with respect to the wheel 47 determines the position of the rocker arm and therefore controls the position of rod 35 and of the core 42 in coil 33. When the channel selector shaft 18 is rotated to change from one channel to another, a different one of the screws 46 is moved into engagement with rocker arm 41, thereby changing its position and that of core 42 in accordance with the setting of the screw.

The screws 46 are preset to provide the desired fine tuning by means of a rotary adjusting device designated generally as 71. In the embodiment of FIGS. 8–11 the device 71 is a screwdriver head including a blade portion 72 which fits into the slots in the screws 46. The body portion 73 of the screwdrive 71 is rotatably mounted in an arm 76 which extends between the channel selector shaft 18 and the fine tuning shaft 50. The screwdrive has a spur gear 77 attached thereto which forms part of a gear train further including an idler gear 78 which is mounted on the arm 76, and a driving gear 79 secured to the fine tuning shaft 50 and rotated thereby. This gear train provides amplification of the rotation of the fine tuning shaft so that the viewer can tune the coil 33 through its entire range without releasing the fine tuning knob 51.

The arm 76 which carries the adjusting device has a forked portion 82 on one end which fits around the channel selector shaft 18, and has a collar portion 83 on the opposite end through which the fine tuning shaft 50 extends. The fine tuning shaft 50 also extends through and is journalled in the frame 52, and is movable both axially and rotatably. Shaft 50 is biased by a spring 84 to a rest position in which the washer 86 abuts against frame 52. When the knob 51 is pushed, the arm 76 is moved toward the cam wheel 47 by the gear 79, thereby moving the adjusting device 71 into engagement with the screws 46 aligned therewith. The adjusting device 71 may then be rotated to change the setting of the engaged screw by rotating the shaft 50 and the gears 77—79. When the fine tuning knob 51 is released, the arm 76 and the fine tuning shaft 71 are returned to the initial position by the biasing spring 84.

Thus, in order to adjust the fine tuning of the television receiver, the viewer rotates the channel selector knob 20 to the position corresponding to the desired channel, and then depresses and rotates the fine tuning knob 51 to engage the adjusting device 71 with the control member corresponding to the selected channel. The fine tuning knob 51 is rotated back and forth until the picture appears to be properly tuned and is then released. This operation may be repeated for each channel, and once the channels are fine tuned in this manner they will not have to be retuned unless there is some change in the signal or in the circuit elements which control the tuning.

The initial or rest position of the fine tuning shaft 50 may be employed to provide continuous tuning of the ultra high frequency channels, as previously mentioned. To accomplish this, a disengageable coupling mechanism 91 is connected between the ultra high frequency section 40 and the shaft 50. The coupling mechanism 91 includes a pair of crown gears 92—93, and these together with a number of pulleys 94—97 transmit rotary motion of shaft 50 to the ultra high frequency tuning shaft 98. The ultra high frequency section 40 is shown in the circuit diagram of FIG. 7 and includes variable capacitors 99 which change the tuning in a continuous manner to select desired UHF channels.

The outer crown gear 93 and the drive pulley 94 are secured to a sleeve 101 which is rotatably journaled in the frame 36. The shaft 50 extends through sleeve 101 and is both axially and rotatably movable with respect to the sleeve. The inner crown gear 92 is secured directly to the shaft 50, and therefore when this shaft is depressed, the crown gear 92 moves away from the crown gear 93 so that shaft 50 is uncoupled from the pulleys 94—97. In this depressed position, shaft 50 is coupled to the fine tuning mechanism by the gears 77—79, the adjusting device 71, and the cam wheel 47 which together constitute a disengageable coupling mechanism. When shaft 50 is released, the spring 84 returns it to the initial position, so that the crown gears 92 and 93 mesh, thereby coupling shaft 50 to the UHF section 40. Rotation of the shaft will rotate sleeve 101 and drive the pulleys 94—97 to control the ultra high frequency tuning of the receiver. Thus, there are actually two disengageable coupling mechanisms associated with shaft 50, one for the depressed position and another for the released position.

The arrangement of the pulleys may be understood by considering FIGS. 8, 9 and 11 together. In FIG. 11 it may be seen that the pulleys 94 and 95 are coupled together by a cord 90 which is also wound around sleeve 101 and certain portions of a pivotal arm 102. Starting from sleeve 101, the cord passes over the end 100 of the arm 102 and then around pin 106. Then the cord passes around pulley 95, around pulley 94 and back around pulley 95. The cord continues around the pin 107, over the other end 99 of the arm 102 and back to sleeve 101. The arm 102 is pivoted on a central pin 103 which is connected to the frame 52. The pivotal movement of the arm 102 is limited by a stop portion 104 extending therefrom through an opening 105 in the frame 52. The arm is constructed of a material which presents relatively small friction to the cord so that the cord can slide over the ends and pins thereon.

Starting in the condition where the arm is in the position illustrated in FIG. 11, if the shaft 50, sleeve 101, and pulley 94 are rotated clockwise, the initial movement of the cord will pivot the arm 102 clockwise until the stop portion 104 abuts one side of the opening through which it extends. When the arm reaches this position, the cord will slide over the ends 99 and 100 and the pins 106 and 107 of the arm 102 to provide high speed direct drive for the pulley 95. Pulley 95 is on the same shaft as pulley 96, and the latter is coupled by a timing belt 110 to pulley 97 which rotates the UHF tuning shaft 98.

When the desired channel is approximately tuned in, the shaft 50 and sleeve 101 may be rotated backwards in the counter clockwise direction in order to fine tune this channel. As sleeve 101 rotates counterclockwise, the cord 90 pivots the arm 102 back to the initial position, and during this pivotal movement of the arm, the pulley 95 moves slowly because of the relatively small movement of the pins 106 and 107 around which the cord extends. Thus, the pivotal arm 102 is a change-speed device which permits high speed rough tuning and then on reverse rotation in either direction, low speed fine tuning of the UHF channels.

As previously stated, the UHF tuner is shown in the circuit of FIG. 7. Signals from the UHF antenna are coupled to a first resonant line 103 which is tuned by two of the capacitors 99. A second resonant line 104, tuned by the remaining two of the capacitors 99, controls the frequency of an oscillator including the tube 105. The received signals from line 103 are mixed with the oscillations from line 104 in crystal detector 108 to provide a difference frequency. The output of the detector, which is a fixed intermediate frequency, is applied to the UHF position on tuner wafer 14. This signal is amplified in the cascode amplifier including the tube 28 and in the mixer 30. The local oscillator **30*a* is inoperative so that the mixer 30 produces the same frequency at output 31 as for VHF operation. The wafer 17 includes contacts for selectively applying B+ to the oscillator tube 105** when the channel selector is switched to the VHF position.

FIGS. 12–17 illustrate another embodiment of the invention which provides both preset fine tuning and automatic channel selection. The parts in FIGS. 12–17 which have corresponding parts are designated by the same reference numerals as in the prior figures. In the embodiment of FIGS. 12–17 the channel selector shaft 18 is driven by a motor 111 which is coupled to the shaft by a gear train enclosed in the gear box 112. The shaft 18 does not extend outside the cabinet wall represented by the fragmentary wall portion 113. On the end of shaft 18 there is a channel indicator projecting disc 114 (see FIG. 13). Numbers corresponding to the VHF channels are blanked out of the disc 114, and these numbers are arranged peripherally on the disc so that they may be revolved successively into alignment with a small projection screen 116 provided behind an opening in the front cabinet wall 113. A source of light is provided by the apertured enclosure 117 and the bulb 119. Thus, as a given channel is selected, light forming the corresponding number will be projected onto the screen 116. The screen may be of frosted glass so that the number will be visible to the viewer.

The preset mechanism including the cam wheel 115 is mounted on the end of the selector shaft 18 which extends toward the back of the receiver cabinet. The preset fine tuning mechanism functions essentially the same as that described in connection with FIGS. 8–11. The main structural difference is that the rotary adjusting device 17 is driven directly by the fine tuning shaft 120 with no coupling gears being provided between the shaft and the screwdriver. The shaft 120 is accessible from the rear of the cabinet.

Figures 12, 13, 14, 15, 16, 17:
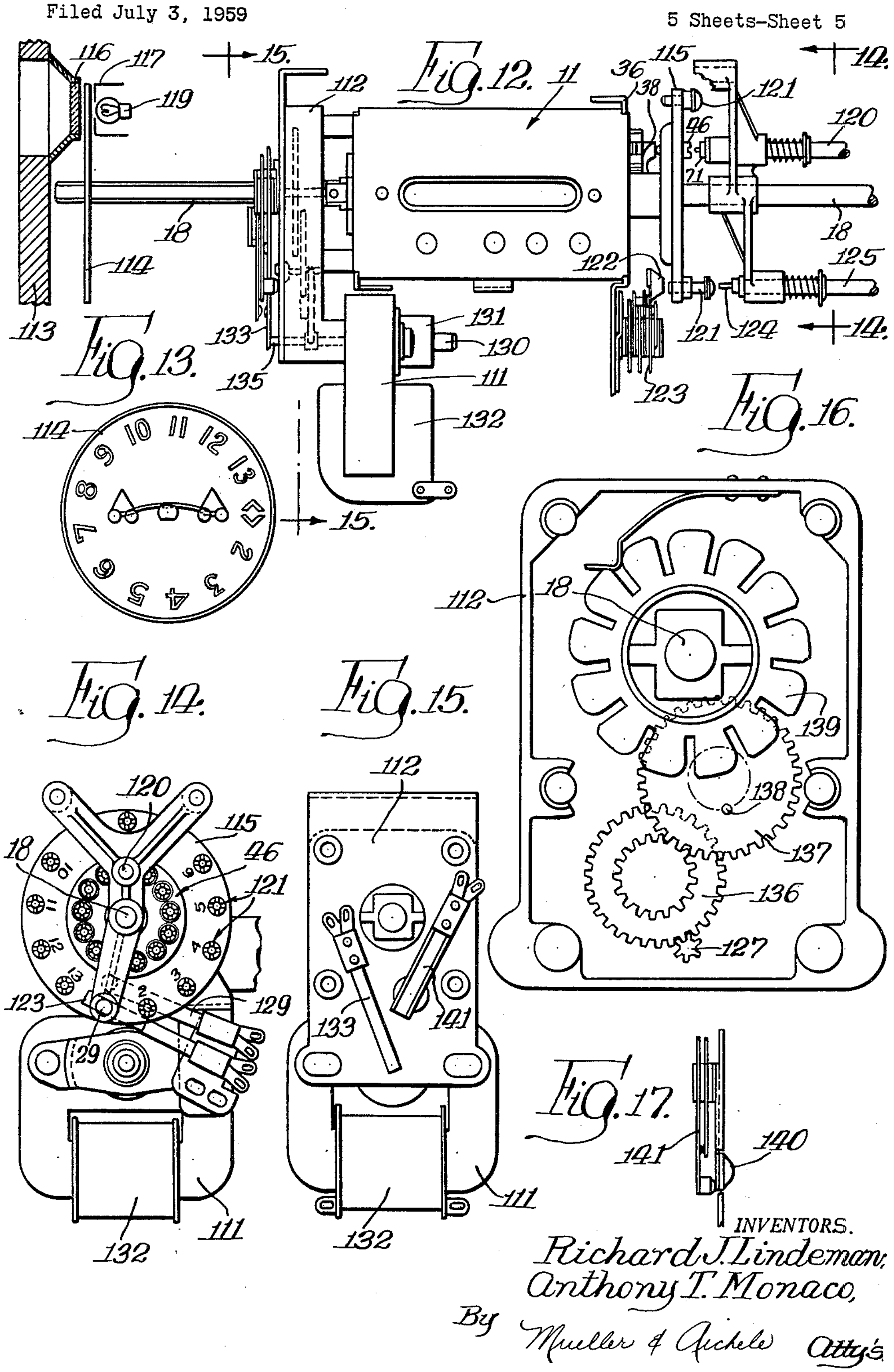
FIG. 12 is an elevational view of a motor driven form of the tuner with a cam wheel which provides preset fine tuning and automatic channel selection.
FIG. 13 is a view of the channel indicator provided in the embodiment of FIG. 12.
FIG. 14 is an end view taken along lines 14—14 of FIG. 12 showing the structure of the cam wheel.
FIG. 15 is a view taken along lines 15—15 of FIG. 12 showing the motor, and the gear box associated therewith.
FIG. 16 is an enlarged view of the gear box of FIG. 12 with the cover plate removed to reveal the internal mechanism.

The face of the cam wheel 115 is shown in FIG. 14. From this view it may be seen that wheel 115 has an inner set of cam screws 46 which provide the preset fine tuning, and an outer set of cam screws 121 which control the motor 111 to provide automatic channel selection. A second cam follower 122 is positioned in the path of the cam screws 121, and this cam follower is a rocker arm which actuates an indexing switch 123 connected in the control circuit of the motor 111. Those of the cam screws 121 corresponding to the channels which are to be selected automatically are screwed in to a position where they will engage the actuator 122 and operate switch 123. The rest of the cam screws 121 corresponding to unused channels will be screwed out to a position where they will pass rocker arm 122. The screws 121 are set by means of an adjusting device 124 with a shaft 125 which is accessible from the rear of the cabinet, and this operates in the same manner as the fine tuning shaft 120.

When the motor 111 is started, either by means of a local switch or a remote control unit, it rotates the selector shaft 18 and the cam wheel 115, thereby moving the next successive cam screw which has been set up into engagement with the actuator 122. This depresses the actuator 122 and operates the switch 123, thereby stopping the motor 111 with the channel selector in the proper position.

The cam wheel 115 may also be provided with a cam which will shut the receiver off when the wheel reaches a predetermined position. This cam may be located at the UHF position of wheel 115, and will engage the switch 129 as shown in FIG. 14. Switch 129 controls the supply of power to the receiver itself, but does not affect the remote control system which may be provided to operate the motor 111. Other swtcihes may be associated with cam follower 122 to provide picture blanking and sound muting as the channels change, as illustrated in FIG. 15.

FIGS. 15 and 16 together with FIG. 12 illustrate the coordination of the motor and reduction gears with the cam wheel 47. The motor 111 is of the declutching type and has a rotor 131 which is pulled axially into the motor body 111 when the windings 132 are energized. The rotor 131 is on a shaft which has an extension projecting through the gear box 112 and terminating in a pin 135 which actuates an interlock switch 133. Switch 133 is normally open, and when the rotor 131 is pulled in, the interlock switch is closed. This switch is in series with the index switch 123, and its function is to permit manual adjustment of the channel selector shaft 18. Every time the cam wheel 115 is rotated so that one of the cams 121 is disengaged from the actuator 122, the index switch 123 closes. Unless the interlock switch is open, this would drive the channel selector to the next cam. The interlock switch is always open when the motor 11 is de-energized as is the case when the shaft 18 is operated manually. Whenever the motor is energized, switch 133 will be closed, and closing of the index switch will cause the motor to drive the channel selector to the next position.

FIG. 16 shows the gear train which couples the motor 111 to the channel selector shaft 18. The gear train includes a gear cluster 136 whose outer teeth mesh with a pinion 127 on the motor shaft 130, and whose inner teeth mesh with a spur gear 137. The spur gear has a pin 138 which drives a Geneva wheeel 139. Each revolution of gear 137 advances the Geneva wheel one step, and this provides considerable reduction such that the torque delivered by the motor 111 does not have to be large. This in turn makes it possible to use a comparatively inexpensive motor.

Because of the delicate fit between the Geneva pin 138 and the wheel 139 it is desirable to prevent the motor from being stopped when the pin is meshed with the wheel 139. This is accomplished by providing a switch 141 on the outside of the gear box which has an actuator 140 extending into the gear box in the path of the pin 138 (see FIG. 17). The switch 141 is connected in parallel with the interlock switch 133 and the index switch 123, and is normally closed. Thus, the motor will only stop when the pin 138 engages the actuator of switch 141 to open it, and this avoids possible binding of the pin and wheel as a result of manual adjustment of the selector shaft 18. The circuit diagram shown in FIG. 18 facilitates an understanding of the operation of the motor circuit. Switch 150 is the main on-off switch of the receiver. This switch is connected in parallel with the switch 129 which provides on-off operation at a predetermined position of the tuner 10. The motor 111 which operates the tuner may be energized through the circuit including pushbutton switch 151 provided on the receiver. After the motor is energized through this circuit, operation of the motor will close switch 133. As the tuner moves away from a set channel the switch 123 will close so that a holding circuit is provided through these two switches to cause continued motor operation until the tuner reaches a set channel to open the switch 123 and de-energize the motor. The switch 141 coupled to the Geneva motion is is parallel with switches 123 and 133 to prevent stopping of the motor except when the Geneva motion is at a set position.

A remote control system 152 (FIG. 18) may be provided in the receiver having a relay with contacts 153. The contacts 153 are in parallel with the pushbutton contacts 151 to start the tuning operation by energizing the motor 110. Accordingly the motor tuning operation can be started either by remote operation or by operation of the pushbutton 151 at the receiver. It is obvious that either of these facilities may be provided or both may be provided if desired.

Another embodiment of the channel selector and tuner in accordance with the invention is illustrated in FIGS. 19 and 20. The construction is similar in many respects to that previously described so only the significant distinctions will be described in detail. Only a fragmentary portion of the tuner is illustrated because it will be apparent that the remaining parts may be provided in accordance with the previous description. In this embodiment, the channel selector shaft 118 extends through and is coaxial with the fine tuning shaft 128. The fine tuning shaft 128 is rotatable about shaft 118 and is also axially movable with respect thereto. Shaft 128 is urged to a rest position by the spring 184. The rotary adjusting device 171 is rotatably mounted on the arm 176 which has a collar portion 183 within spring 184 and through which the selector shaft 118 extends. One end of the fine tuning shaft 128 against the arm 176 so that when this shaft is moved axially, it pushes the arm 176 and moves the rotary adjusting device 171 into engagement with the cam screw aligned therewith. The cam screws 146 are carried in a circular array on the cam wheel 147 which is mounted on the channel selector shaft by means of a hub 148 in the same manner as described in connection with FIGS. 1–4. The screws 146 have cup-shaped heads with a serrated edge which grips the resilient end portion 172 of the adjusting device 171. A support bracket 190 is secured to the frame 150 and provides additional support for the adjusting device 171 while permitting it to rotate and move axially. The body portion 173 of the adjusting device has a spur gear 177 attached thereto which meshes with the driving gear 179 secured to the fine tuning shaft 128. Thus, the fine tuning shaft 128 is depressed axially to engage the adjusting device 171 with the control member 146 aligned therewith, and is then rotated to adjust the axial position of the control member. The gears 177 and 179 speed up the rotation of the device compared to the fine tuning shaft to facilitate setting up the fine tuning as previously explained.

The coil 33, the coil form 34, the core 35 and the rocker arm 41 are all provided in accordance with the previous description, and their operation is the same as previously described.

The embodiment of FIGS. 21 and 22 is a modification of the embodiment of FIGS. 19 and 20, and therefore the same reference numerals are applied to like parts. The main differences are that the variable circuit element which provides the fine tuning is a capacitor consisting of a fixed plate 201 and a movable plate 202. The latter is controlled by a pivotal rocker arm 203 having a cam follower roller 204 cooperating with disc cams 205.

The disc cams have body portions which extend through the cam wheel 147 and have cup-shaped heads 206 on the other side of the wheel. The teeth 207 on the cups 206 mesh with teeth 208 on the rotary adjusting device 209. The arrangement of the gears 177 and 179, the arm 173 and spring 184 is in accordance with the description of FIGS. 9 and 10.

The disc cams 205 have a heart shape and are arranged circularly on the wheel 147 so that the disc corresponding to the selected channel engages the cam follower roller 204 and positions the rocker arm 203 and capacitor plate 202. When shaft 118 is rotated to select a different channel, a different disc cam is brought into engagement with the cam roller 204 and moves arm 203 and capacitor plate 202 to a new position. The discs 205 are adjusted by depressing shaft 128 to engage the rotary adjusting device 209 with the head 206 of the cam aligned therewith, and by rotating shaft 128 until the desired picture is obtained. It may be noted that the adjustable cams 206 do not move axially, but rather are adjusted to a desired angular position to control the rocker arm 203.

The embodiment of FIG. 23 is a modification of the embodiment of FIGS. 19 and 20, and illustrates a fine tuning device which does not have a separate cam follower member such as the rocker arms 38, 138, and 203 described in connection with the other embodiments. Only part of the mechanism is shown since this serves to illustrate the modified construction. The fine tuning circuit element is a book-type capacitor including a fixed plate 211 and a movable plate 212 with a cam follower 213 provided directly on the plate 212. The follower 213 is moved as the screws 146 (only one is shown) are rotated into engagement therewith by the channel selector shaft 118. The fine tuning shaft 128 is coaxial with shaft 118 and is both rotatable and axially movable to control the rotary adjusting device 171 as previously described.

It is apparent from the foregoing description that the tuning system of the invention is of economical construction and is capable of providing various types of tuning. The basic VHF television tuner may be combined with UHF tuning and may be either manual or motor driven for remote control. Fine tuning is provided which may be preset to control each channel independently of the others through operation of a cam wheel which controls a single variable circuit element. The cam wheel may also control the motor of an automatic tuning system if this is desired. The fine tuning shaft may drive the ultra high frequency tuner, and this is accomplished without interfering with the fine tuning settings. The fine tuning device provides a wide tuning variation for all the VHF channels.

We claim:

1. A tuning system for a television receiver including in combination, main tuning means for selecting channels in two spaced tuning ranges and including rotary switch means having wafers and a rotary shaft, said main tuning means including oscillator means tunable to two bands of frequencies associated with said tuning ranges, a fine tuning device coupled to said oscillator means including a coil with a core movable therein, said device being resonant at a frequency intermediate said two bands of frequencies and thereby providing a substantially constant wide frequency variation in the channels of both bands in response to movement of said core, rotary means forming a cam connected to said shaft, and means operatively coupling said core to said cam, said cam having portions in different positions along the longitudinal axis of said shaft and with respect to said fine tuning device so that upon rotation of said cam said portions thereof control the movement of said core to position the same to establish the desired fine tuning.

2. A tuning system for a television receiver including in combination, main tuning means for selecting channels in two spaced tuning ranges and including rotary switch means having wafers and a rotary shaft, said main tuning means including oscillator means tunable to two bands of frequencies associated with said tuning ranges, a fine tuning device coupled to said oscillator means including a coil with a core movable therein, said device being resonant at a frequency intermediate said two bands of frequencies and thereby providing a wide frequency variation in the channels of both bands in response to movement of said core, rotary means connected to said shaft forming a cam disposed circularly about an axis, and means operatively coupling said core to said cam, said cam having portions in different positions with respect to said axis and said fine tuning device so that upon rotation of said cam said portions thereof control the movement of said core to position the same to establish the desired fine tuning.

3. A tuner for use with television receivers including in combination, main tuning means including oscillator means and rotary channel selector means for controlling said oscillator means to select channels in two spaced bands of frequencies in the very high frequency range, fine tuning circuit means connected to said oscillator means and being resonant at a frequency within the frequency limits of said frequency range and substantially below the higher of said frequency bands, said fine tuning circuit means including a coil and a core movable therein providing a constant wide frequency variation in all of the selected channels, a cam follower associated with said movable core of said fine tuning circuit means for moving the same to establish desired fine tuning settings, a plurality of independently adjustable cams corresponding to channels of said channel selector means and each engageable with said cam follower to establish selected positions for said movable core of said fine tuning circuit means, a spring bias rotary adjusting device slidable against the spring bias to be individually engageable with each of said cams for adjusting the same, a wheel carrying said cams in a circular array about said channel selector means and rotatable thereby to move the cam corresponding to the selected channel into engagement with said cam follower and into alignment with said rotary adjusting device, and actuating means operable to engage said adjusting device with the cam aligned therewith and to rotate said device for adjusting the engaged cam independently of the other cams.

4. A fine tuning device for a television tuner of the channel selector type having a rotatable selector shaft, said fine tuning device including in combination, a fine tuning shaft, means supporting said fine tuning shaft for rotary movement and axial movement in a direction substantially parallel to the axis of the selector shaft, spring means urging said fine tuning shaft axially to a rest position, fine tuning circuit means including a movable element, positioning means associated with said movable element of said fine tuning circuit means for moving the same to establish desired fine tuning settings, a plurality of independently adjustable fine tuning control members corresponding to channels of said channel selector means, each of said tuning control members being engageable with said positioning means to establish selected positions for said movable element of said fine tuning circuit means, a rotary adjusting member positioned opposite said control members, a wheel on the selector shaft supporting said tuning control members circularly about the selector shaft, said wheel being rotatable by the selector shaft to move said tuning control members into successive alignment with said rotary adjusting member and into engagement with said positioning means, means including gear means interconnecting said fine tuning shaft and said adjusting member for transmitting rotary movement therebetween, a further rotatable channel selector coupled to said fine tuning shaft to be rotated thereby for selection of UHF television channels, and a fine tuning knob on said fine tuning shaft depressible to move said fine tuning shaft axially against the force of said spring means thereby moving said adjusting member into engagement with the tuning control aligned therewith, said fine tuning knob being rotatable to adjust the engaged tuning control member to a desired setting.

5. A fine tuning device for a television tuner of the channel selector type including in combination, a rotary selector shaft, a fine tuning shaft, means supporting said fine tuning shaft for rotary movement and axial movement independently of said selector shaft, spring means urging said fine tuning shaft axially to a rest position, a wheel mounted on said selector shaft and rotatable thereby, a plurality of independently adjustable cam screws mounted in a circular array on said wheel, fine tuning circuit means having a movable element in the rotational path of said cam screws and movable thereby to establish desired fine tuning settings, a rotary adjusting device positioned opposite said cam screw, means interconnecting said fine tuning shaft and said adjusting member for transmitting rotary movement therebetween, a further rotatable channel selector coupled to said fine tuning shaft in the rest position thereof, and a fine tuning knob on said fine tuning shaft depressible to move said fine tuning shaft axially against the force of said spring means thereby moving said adjusting device into engagement with the cam screw aligned therewith, said fine tuning knob being rotatable to adjust the engaged cam screw to a desired position and being rotatable in the undepressed position to adjust said further rotatable channel selector.

6. In a television receiver, a tuning system including in combination, very high frequency tuning means, ultra high frequency tuning means, channel selector means associated with said tuning means having a plurality of positions corresponding to very high frequency channels and another position corresponding to ultra high frequency channels, fine tuning means associated with said very high frequency tuning means, a control shaft, means supporting said control shaft for rotary movement and axial movement, means defining first and second axial positions for said control shaft, first disengageable coupling means connecting said control shaft to said fine tuning means when said control shaft is in said first position thereof, and second disengageable coupling means connecting said control shaft to said ultra high frequency tuning means when said control shaft is in said second position thereof, whereby rotation of said control shaft in said first axial position thereof controls the fine tuning of the television receiver, and rotation of said control shaft in said second axial position thereof controls the ultra high frequency tuning of the television receiver.

7. In a television receiver, a tuning system including in combination, channel selector means including a rotary selector shaft, a control shaft, means supporting said control shaft for rotary and axial movement between first and second axial positions, fine tuning circuit means including a movable tuning element, a cam follower associated with said tuning element for moving the same, a wheel mounted on said selector shaft and rotatable thereby, a plurality of adjustable cams supported on said wheel in a circle about said shaft and engageable with said cam follower, a rotary adjusting device coupled to said control shaft for rotation and axial movement thereby, said rotary adjusting device being positioned opposite said cams, means for rotating said wheel to align said cams with said rotary adjusting device, said adjusting device being engaged with the cam aligned therewith when said control shaft is in said first axial position and being disengaged from said cam when said control shaft is in said second axial position, ultra high frequency tuning means including a rotary tuning shaft, pulley means coupled to said tuning shaft for rotating the same, a first gear connected to said pulley means and a second gear connected to said control shaft, said gears meshing when said control shaft is in said second axial position and being disengaged when said control shaft is in said first axial position, whereby said control shaft provides preset fine tuning adjustments and continuous ultra high frequency tuning.

8. In a television receiver, a tuning system including in combination, channel selector means including a rotary selector shaft, a control shaft, means supporting said control shaft for rotary and axial movement between first and second axial positions, fine tuning circuit means including a movable tuning element, cam means having a plurality of adjustable portions mounted on said selector shaft and rotatable thereby for engagement with said movable tuning element, a rotary adjusting device coupled to said control shaft for adjusting said cam portions in the first position thereof, ultra high frequency tuning means including a rotary tuning shaft, means coupling said rotary tuning shaft to said control shaft in the second position thereof, said last named means providing vernier adjustment of said rotary tuning shaft upon reverse of the direction of rotation of said control shaft for a limited extent of rotation followed by direct driving of said rotary tuning shaft upon continued rotation in the same direction, whereby said control shaft provides fine tuning adjustments and continuous ultra high frequency tuning.

9. In a television receiver, a tuning system including in combination, first tuning means including a rotary shaft, a control shaft, means supporting said control shaft for rotary movement and for axial movement between first and second axial positions, fine tuning circuit means including a movable tuning element, a cam follower coupled to said tuning element for moving the same, a support member, a plurality of adjustable cams carried on said support member in a circular array and individually engageable with said cam follower, a rotary adjusting device movable axially with and rotatable by said control shaft, a first driving element connected to said first tuning means and a second driving element connected to said control shaft, said driving elements being in coupled relation when said control shaft is in said first axial position and being uncoupled when said control shaft is in said second axial position, and said adjusting device being engaged with a cam aligned therewith when said control shaft is in said second axial position and being disengaged from said cam when said control shaft is in said first axial position, whereby said control shaft provides preset fine tuning adjustment in said first axial position thereof and drives said first tuning means in said second axial position thereof.

10. In a television receiver, a tuning system including in combination, first tuning means for selecting television channels and including a rotary shaft, a manually rotatable control shaft, means supporting said control shaft for rotary movement and for axial movement between first and second axial positions, spring means biasing said control shaft to the first axial position, fine tuning circuit means including a movable tuning element, a cam follower lever engageable with said tuning element for moving the same, a cam wheel, a plurality of adjustable cams carried on said cam wheel in a circular array and individually engageable with said cam follower lever, a cam adjuster rotatable by said control shaft and movable axially therewith, a disengageable coupler connecting said control shaft to said rotary shaft in the first axial position and disconnecting the same when said control shaft is in the second axial position, and said cam adjuster being engaged with a cam aligned therewith with said control shaft in the second axial position and being disengaged from such a cam with said control shaft in the first axial position, whereby manually rotatable control shaft provides a present fine tuning adjustment in the first axial position thereof and drives said first tuning means in the second axial position thereof.

11. In a television receiver, a tuning system including in combination, rotatable means for operating the tuner and providing channel selection therein, fine tuning circuit means including a movable tuning element, a cam follower lever engageable with said tuning element for moving the same, a cam wheel affixed to and rotatable with a portion of said rotatable means, a plurality of adjustable cams carried on said cam wheel and individually associated with television channels and individually engageable with said cam follower lever, a manually rotatable tuning control with support means therefor engageable with a portion of said rotatable means, said tuning control being supported for rotary movement and for axial movement between first and second positions, means biasing said tuning control to the first position, a cam adjuster and a gear drive coupling said cam adjuster to said tuning control so that the cam adjuster is rotatable and axially movable therewith, a disengageable coupler joining said tuning control to another portion of said rotatable means in the first axial position and disconnecting the same with said tuning control in the second axial position, and said cam adjuster being engaged with a cam aligned therewith when said tuning control is in the second axial position and being disengaged from such a cam when said tuning control is in the first axial position, whereby said manually rotatable tuning control provides both a preset fine tuning adjustment and television channel selection in the different axial positions thereof.

References Cited in the file of this patent

UNITED STATES PATENTS

| | | |
|---|---|---|
| 1,625,234 | Wittgenstein | Apr. 19, 1927 |
| 2,551,228 | Achenbach | May 1, 1951 |
| 2,580,895 | De Tar | Jan. 1, 1952 |
| 2,802,946 | Feigl | Aug. 13, 1957 |
| 2,839,936 | Dawson | June 24, 1958 |
| 2,947,866 | Valdettaro et al. | Aug. 2, 1960 |